United States Patent
Kim et al.

(10) Patent No.: US 7,200,369 B2
(45) Date of Patent: Apr. 3, 2007

(54) LINC POWER TRANSMITTER

(75) Inventors: Bumman Kim, Pohang (KR); Youngoo Yang, Newbury Park, CA (US); Young Yun Woo, Pohang (KR); Jae Hyok Yi, Pohang (KR); Seung Woo Kim, Pohang (KR)

(73) Assignee: Postech Foundation, Pohang (KR)

( * ) Notice: Subject to any disclaimer, the term of this patent is extended or adjusted under 35 U.S.C. 154(b) by 411 days.

(21) Appl. No.: 10/767,172

(22) Filed: Jan. 30, 2004

(65) Prior Publication Data

US 2004/0185805 A1 Sep. 23, 2004

(30) Foreign Application Priority Data

Feb. 21, 2003 (KR) ...................... 10-2003-0010971

(51) Int. Cl.
*H04B 1/04* (2006.01)
*H04B 1/18* (2006.01)
*H01Q 11/12* (2006.01)

(52) U.S. Cl. ............................... 455/114.3; 455/127.1; 455/177.1; 330/2; 330/285

(58) Field of Classification Search ............ 455/114.3, 455/114.2, 127.1, 127.2, 130, 177.1, 183.1, 455/189.1, 209, 224.1, 232.1, 239.1, 255, 455/277.2
See application file for complete search history.

(56) References Cited

U.S. PATENT DOCUMENTS

| 5,426,641 | A | * | 6/1995 | Afrashteh et al. | .......... 370/347 |
| 5,822,200 | A | * | 10/1998 | Stasz | ....................... 363/21.18 |
| 5,990,734 | A | * | 11/1999 | Wright et al. | .................. 330/2 |
| 6,538,515 | B2 | * | 3/2003 | Brandt | ........................ 330/285 |

* cited by examiner

*Primary Examiner*—Tony T. Nguyen
(74) *Attorney, Agent, or Firm*—Rothwell, Figg, Ernst & Manbeck

(57) ABSTRACT

A linear amplification with nonlinear components (LINC) power transmitter is provided. The LINC power transmitter includes a digital signal processing unit which controls the LINC power transmitter; a frequency modulation unit which modulates or converts a digital signal output from the digital signal processing unit into a radio-frequency (RF) signal; a signal amplification unit which amplifies the RF signal output from the frequency modulation unit using a gain amplifier and a power amplification module; and a direct current/direct current (DC/DC) conversion unit which controls bias of the power amplification module. Here, the DC/DC conversion unit controls a base bias and/or a collect bias of the power amplification module, and the power amplification module operates in saturation.

10 Claims, 4 Drawing Sheets

LINC POWER TRANSMITTER

BACKGROUND OF THE INVENTION

This application claims the priority of Korean Patent Application No. 2003-10971, filed on Feb. 21, 2003, in the Korean Intellectual Property Office, the disclosure of which is incorporated herein in its entirety by reference.

1. Field of the Invention

The present invention relates to a linear amplification with nonlinear components (LINC) power transmitter, and more particularly, to a LINC power transmitter which has better linear characteristics, higher efficiency, and less DC power consumption by forcefully saturating a main power amplifier and controlling the output of the main power amplifier to be at any desired level through an adjustment of a DC bias voltage of the main power amplifier.

2. Description of the Related Art

Even though it is common knowledge among those skilled in the art that efficiency and linearity are the most important factors that need to be considered in the manufacture of a power transmitter for a CDMA-type wireless terminal, many people still think that it is almost impossible to meet two requirements of a power transmitter for a CDMA-type wireless terminal, i.e., high efficiency and high linearity, at the same time based on the notion that efficiency is a trade-off for linearity and vice versa.

Due to the characteristics of a wireless terminal, a power transmitter generally outputs power much lower than its maximum capability. What really matters in transmitting power more efficiently is not the efficiency of a power transmitter at higher power levels but the efficiency of the power transmitter at lower power levels.

Even though a variety of techniques of enhancing efficiency and linearity at the same time have been adopted in conventional power transmitters for wireless terminals, the conventional power transmitters still seem to have a long way to go to be competitive enough in terms of achieving high efficiency even in a lower power range. A conventional linear amplification with nonlinear components (LINC) power transmitter shown in FIG. 1 is definitely not an exception to this notion.

As compared with typical power transmitters, the conventional LINC power transmitter of FIG. 1 can be considered almost perfect in terms of linearity but poor in terms of efficiency, in particular, at lower power levels. In the conventional LINC power transmitter of FIG. 1, bias of power amplifiers 62 and 64 is fixed to a predetermined voltage level by a fixed voltage power supplier 80. In addition, the output power level of the conventional LINC power transmitter of FIG. 1 is determined depending on gain variations in variable gain amplifiers (VGA) 51 and 52. Therefore, it is almost impossible for the convention LINC power transmitter of FIG. 1 to maintain high efficiency over a wide range of power levels. In FIG. 1, reference numeral 10 represents a digital signal processor, reference numeral 12 represents a signal component separator, reference numerals 21 through 24 represent digital/analog converters (D/A), reference numerals 31 through 34 represent low pass filters (LO), reference numerals 42 and 44 represent quadrature modulators, reference numeral 46 represents a local oscillator, reference numerals 53 and 54 represent gain amplifiers, represent numeral 60 represents a power amplification module, and reference numeral 70 represents signal combiner. The elements of the conventional LINC power transmitter of FIG. 1 are well known to those skilled in the art, and thus their detailed description will not be presented here in this disclosure.

SUMMARY OF THE INVENTION

The present invention provides a linear amplification with nonlinear components (LINC) power transmitter which has better linear characteristics, higher efficiency, and less DC power consumption by forcefully saturating a main power amplifier and controlling the output of the main power amplifier to be at any desired level through an adjustment of a DC bias voltage of the main power amplifier.

According to an aspect of the present invention, there is provided a linear amplification with nonlinear components (LINC) power transmitter. The LINC power transmitter includes a digital signal processing unit which controls the LINC power transmitter; a frequency modulation unit which modulates or converts a digital signal output from the digital signal processing unit into a radio-frequency (RF) signal; a signal amplification unit which amplifies the RF signal output from the frequency modulation unit using a gain amplifier and a power amplification module; and a direct current/direct current (DC/DC) conversion unit which controls bias of the power amplification module. Here, the DC/DC conversion unit controls a base bias and/or a collect bias of the power amplification module, and the power amplification module operates in saturation.

Preferably, the digital signal processing unit includes a signal component separator which separates a predetermined signal into its components; a local oscillator controller which controls a local oscillator of the frequency modulation unit; and a bias/level controller which controls the base bias signal and the collect bias signal to be provided to the signal amplification unit.

Preferably, the frequency modulation unit includes a digital/analog (D/A) converter which receives a digital signal output from the signal component separator and converts the received digital signal into an analog signal; a low pass filter which only passes a low frequency signal among analog signals output from the D/A converter; a quadrature modulator which quadrature-modulates a signal output from the low pass filter; and a local oscillator which provides an oscillation signal to operate the quadrature modulator.

Preferably, the signal amplification unit includes a gain amplifier which amplifies gain of a signal output from the quadrature modulator; a power amplification module which amplifies a signal output from the gain amplifier using the base bias and collect bias of the DC/DC conversion unit; and a signal combiner which combines output signals from the power amplification module.

Preferably, the power amplification module comprises a power amplifier corresponding to the gain amplifier and is a commonly-used amplifier or a differential amplifier.

Preferably, the DC/DC conversion unit comprises a DC/DC converter which is controlled by the bias/level controller of the digital signal processing unit, provides the base bias and the collect bias to the power amplification module and adjusts an output level of the power amplification module by bias control.

Preferably, the power amplification module comprises a virtual ground for removing a predetermined error signal.

Preferably, the power amplification module further comprises an impedance matching load which is connected to the virtual ground and removes the error signal.

Preferably, the LINC power transmitter is able to be applied to a software defined radio (SDR) power transmitter which changes communication modes using software.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will be described more fully with reference to the accompanying drawings in which preferred embodiments of the invention are shown. In this disclosure, detailed descriptions of conventional techniques and conventional structures that are considered related to the present invention may not be presented if this will make the concept or scope of the present invention unnecessarily unclear. In addition, all terms mentioned throughout this disclosure are the ones generally defined based on the functions of what they represent in the present invention, and thus their definitions may vary depending on users' intent or custom. Therefore, those terms should be defined based on the content of the present invention presented here in the present disclosure.

The present invention relates to a LINC power transmitter which is capable of achieving higher linearity and higher efficiency at the same time. More specifically, the LINC power transmitter is considered as having superior linear characteristics, and is also capable of achieving higher efficiency at the same time by forcing a main power amplifier of the LINC power transmitter to operate in saturation with a high-level input signal and controlling the output of the main power amplifier to be at any desired level through an adjustment of a bias voltage of the main power amplifier. The reason that the LINC power transmitter has been adopted as the subject of the present invention is the characteristics of a LINC amplifier that linearity hardly deteriorates under any bias conditions. As described above, by adjusting the bias voltage of the main power amplifier, the efficiency of the LINC power transmitter according to the present invention can remain high in a lower power range as well as in a higher power range, because the LINC power transmitter according to the present invention only consumes a minimum amount of DC power to output desired radio frequency (RF) power. In this regard, the LINC power transmitter according to the present invention is considered suitable for a mobile communication terminal because it can successfully achieve high efficiency even in a lower power range.

Figure 1:
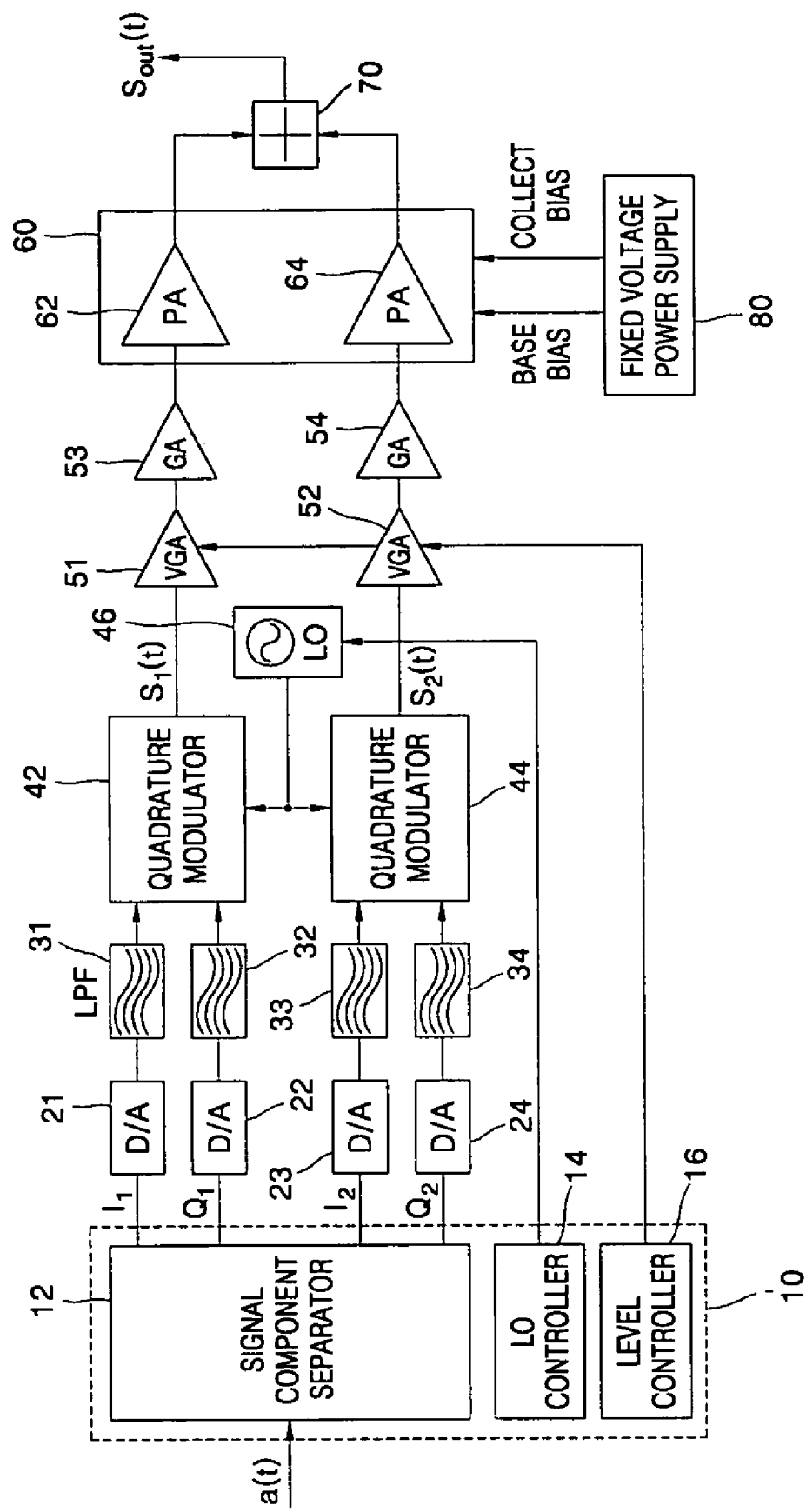
FIG. 1 is a block diagram of a conventional linear amplification with nonlinear components (LINC) power transmitter.
Figure 2:
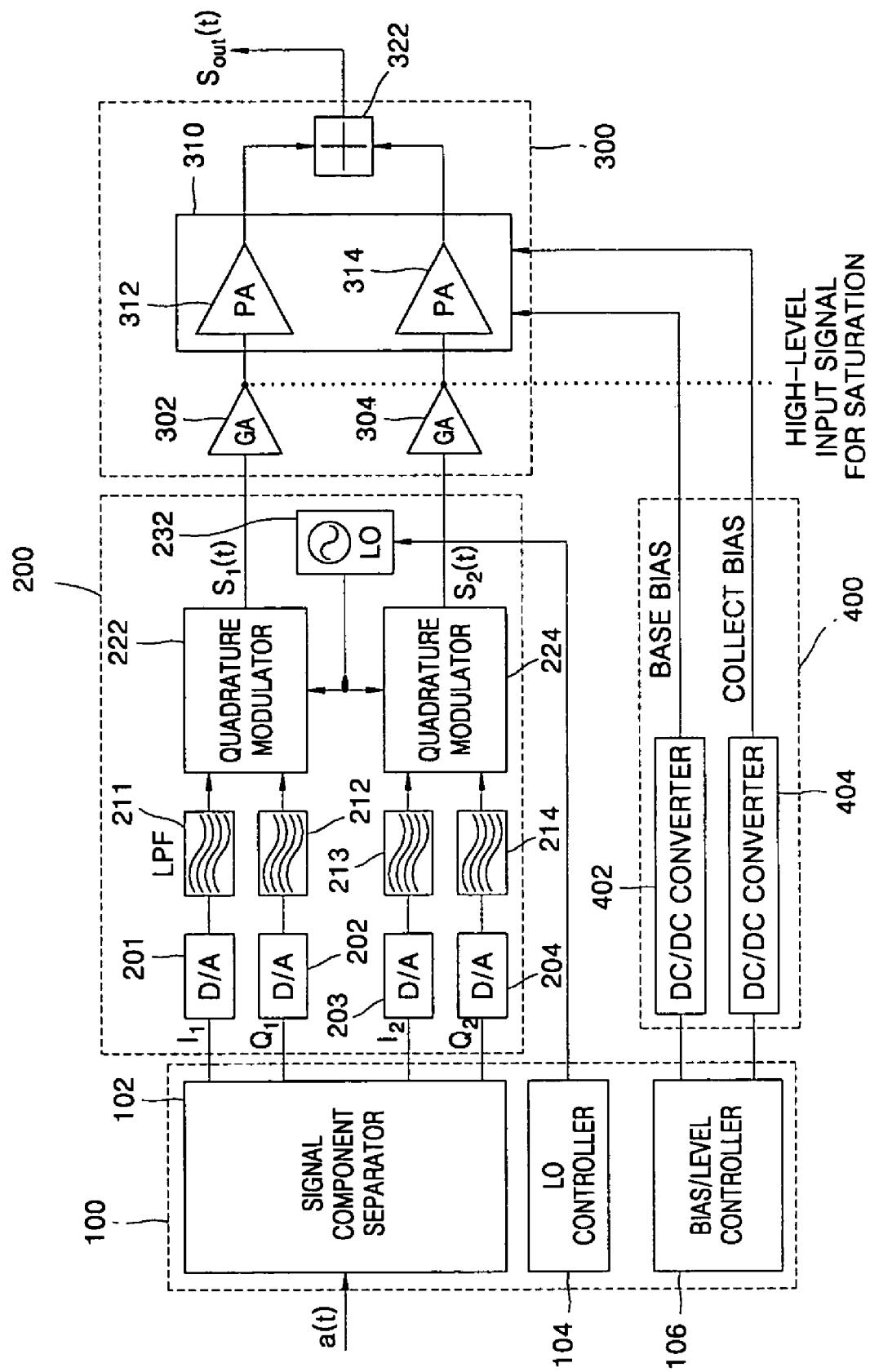
FIG. 2 is a block diagram of a LINC power transmitter according to a preferred embodiment of the present invention.

Referring to FIG. 2, a LINC power transmitter according to a preferred embodiment of the present invention includes a digital signal processing unit 100 which controls the inside of the LINC power transmitter, a frequency modulation unit 200 which modulates a digital signal output from the digital signal processor 10 into an RF signal, a signal amplification unit 300 which amplifies the RF signal modulated by the frequency modulation unit 200 using a gain amplifier (GA) 302 or 304 and a power amplifier (PA) 312 or 314, and a DC/DC conversion unit 400 which controls bias voltage of the power amplifier (PA) 312 or 314. As shown in FIG. 2, the digital signal processing unit 100 includes a signal component separator 102 which receives a predetermined signal a(t) and separates the received predetermined signal a(t) into its components, a local oscillator controller 104 which controls a local oscillator 232 of the frequency modulation unit 200, and a bias/level controller 106 which controls a base bias signal and a collect bias signal provided to a power amplification module 310 of the signal amplification unit 300.

The frequency modulation unit 200 includes digital/analog (D/A) converters 201, 202, 203, and 204 which receive digital signals I1, Q1,I2, and Q2, respectively, from the signal component separator 102 and convert their respective received digital signals into analog signals, low pass filters 211, 212, 213, and 214 which only pass low frequency signals among analog signals output from the D/A converters 201, 202, 203, and 204, quadrature modulators 222 and 224 which quadrature-modulate signals output from the low pass filters 211, 212, 213, and 214, and the local oscillator 232 which provides an oscillation signal to operate the quadrature modulators 222 and 224.

The signal amplification unit 300 includes gain amplifiers (GA) 302 and 304 which amplify gains of signals output from the quadrature modulators 222 and 224, a power amplification module 310 which amplifies signals output from the gain amplifiers 302 and 304 in response to the base bias signal and the collect bias signal, and a signal combiner 322 which combines output signals from the power amplification module 310. The power amplification module 310 includes power amplifiers (PA) 312 and 314 which correspond to the gain amplifiers 302 and 304, respectively, and amplify signals output from the gain amplifiers 302 and 304. Preferably, the power amplifiers 312 and 314 could be typical amplifiers or differential amplifiers.

The DC/DC conversion unit 400 includes DC/DC converters 402 and 404 which are controlled by the bias/level controller 106 and provide the base bias signal and the collect bias signal, respectively, to the power amplifiers 312 and 314, respectively, of the power amplification module 310.

The operation of the LINC power transmitter of FIG. 2 will be described in greater detail in the following paragraphs with reference to FIGS. 2 through 5.

The signal component separator 102 of the digital signal processing unit 100 creates signals necessary for performing a LINC operation. More specifically, the signal component separator 102 performs pre-treatment for separating the predetermined signal a(t), which is a phase-modulated signal having a non-constant envelope, into two phase-modulated signals $S_1(t)$ and $S_2(t)$ having a constant envelope, a process which can be expressed by Equation (1) below.

$$S_1(t) = \frac{a(t)}{2} + e(t), S_2(t) = \frac{a(t)}{2} - e(t) \qquad (1)$$

In Equation (1), e(t) represents an arbitrary signal which is added to or subtracted from the predetermined signal a(t) with half amplitude in order to obtain a signal having a constant envelope.

In other words, the signal component separator 102 and the frequency modulation unit 200 convert the predetermined signal a(t) into $S_1(t)$ or $S_2(t)$ by adding e(t) to the predetermined signal a(t) with half amplitude or subtracting e(t) from the predetermined signal a(t) with half amplitude. This process divides a phase-modulated signal having a non-constant envelope, like a CDMA signal, into phase-modulated signals having a constant envelope, which are necessary for performing a LINC operation. Thereafter, $S_1(t)$ and $S_2(t)$ are directly converted into radio frequencies (RF) by the frequency modulation unit 200 and then the radio frequencies are amplified by the signal amplification unit 300. Since the phase-modulated signals $S_1(t)$ and $S_2(t)$ have a constant envelope, they are hardly affected by non-linearity of the amplifiers 302, 304, 312, and 314 of the signal amplification unit 300 irrespective of whether they are high-level signals or low-level signals. Therefore, a highly efficient saturation amplifier can be used. The signal combiner 322 removes e(t) from a signal amplified by the signal amplification unit 200 so that an original phase-modulated signal having a non-constant envelope can be restored.

Therefore, the LINC power transmitter according to the present invention can perform highly linear power transmission.

In the meantime, the LINC power transmitter according to the present invention can also control quadrature bias to guarantee high efficiency, which will be described more fully in the following paragraphs.

Referring to FIG. 2, in the present invention, the power amplifiers 312 and 314 are forced to operate in saturation with a high-level input signal, and then an output level of the LINC power transmitter is adjusted by controlling quadrature biases output from the DC/DC converters 402 and 404. Bias signals, i.e., the base bias signal and the collect bias signal, are applied to the power amplifiers 312 and 314, respectively, by the DC/DC converters 402 and 404, respectively, and the DC/DC converters 402 and 404 are controlled by the bias/level controller 106 of the digital signal processing unit 100. Even under different sets of bias conditions, power of the same level can be obtained from the LINC power transmitter. The bias/level controller 106 controls the DC/DC converters 402 and 404 so that the power amplifiers 312 and 314 can operate under a predetermined set of bias conditions where their efficiency can be maximized. In short, it is possible to adjust the output power of the LINC power transmitter and to maximize the efficiency of the LINC power transmitter at any given output level by controlling the bias signals. Therefore, the LINC power transmitter according to the present invention can maintain high efficiency over a wider range of power levels. Since a power transmitter for a terminal changes its power level very slowly, the DC/DC converters 402 and 404 do not need to quickly perform switching operations, and thus it is rather easy to realize the DC/DC converters 402 and 404. The LINC power transmitter according to the present invention preferably controls both the base bias signal and the collect bias signal. However, the LINC power transmitter according to the present invention still can maintain high efficiency to some extent by controlling either the base bias signal or the collect bias signal.

Figure 3:
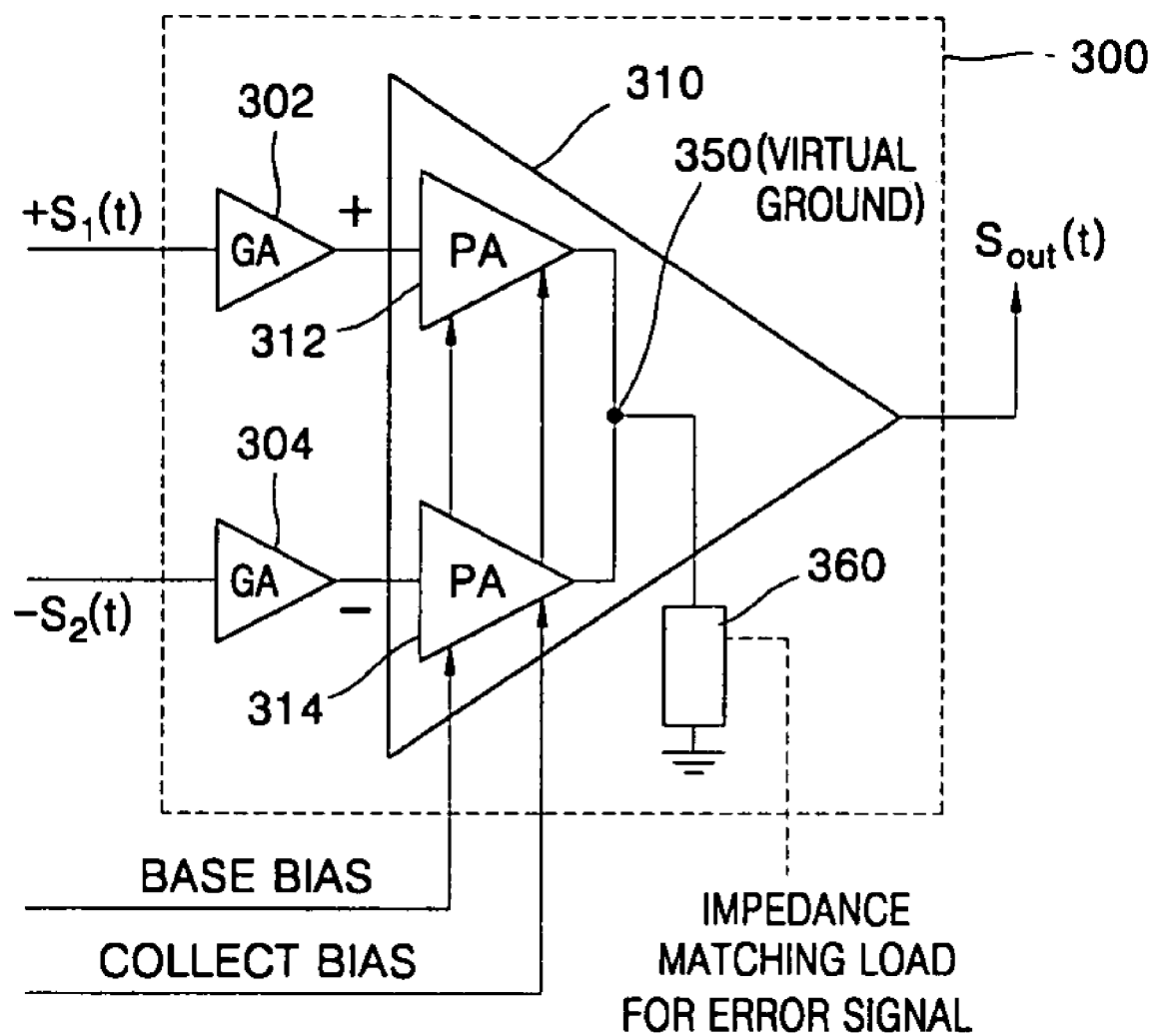
FIG. 3 is a detailed block diagram of a power amplification module of a LINC power transmitter according to a preferred embodiment of the present invention.

The power amplification module 310 in the LINC power transmitter of FIG. 2 could be a typical, commonly-used amplifier or a differential amplifier like the one shown in FIG. 3. In the case of using a differential amplifier as the power amplification module 310, signals $+S_1(t)$ and $-S_2(t)$ are input into (+) and (−) input ports, respectively, of the differential amplifier.

The signal $-S_2(t)$ is a reverse signal of $S_2(t)$ obtained by the frequency modulation unit 200. Since the power amplification module 310 operates like a differential amplifier, an output signal $S_{out}(t)$ can be obtained by obtaining a signal amplification gain from $S_1(t)+S_2(t)$. In short, as described above, a differential amplifier could be used as the power amplification module 310 of the LINC power transmitter according to the present invention.

In the case of using a differential amplifier as the power amplification module 310, however, it may be difficult to precisely strike a common-mode balance between the two power amplifiers 312 and 314 of the power amplification module 310, which results in incomplete elimination of the error signal e(t). As part of preparations to prevent this problem, an impedance matching load 360 for the error signal e(t) is further provided to the signal amplification unit 300 of FIG. 2 at a virtual ground 310, as shown in FIG. 3. By doing so, the problem of incomplete compensation of the error signal e(t), caused by a failure in striking a common-mode balance between the two power amplifiers 312 and 314, can be solved.

The power amplification module 310 has little effect on communication modes, making it possible to quickly change communication modes, such as CDMA, TDMA, and FDMA modes, by controlling the digital signal processing unit 100 using software. In other words, the LINC power transmitter according to the present invention allows its communication mode to change, for example, from a CDMA mode to a GSM mode or vice versa, depending on the user environment. Therefore, roaming services can be facilitated in countries that can provide wireless communications. Therefore, it is possible to more easily apply the present invention to software defined radio (SDR) technology that can flexibly change communication modes through a software-wise manner.

In order to compare the performance of the LINC power transmitter according to the present invention with that of other conventional power transmitters, a LINC power transmitter for a CDMA terminal that operates in a 1.71 GHz digital cellular system (DCS) frequency band was designed and manufactured, and then the characteristics of the LINC power transmitter were compared with those of a conventional LINC power transmitter and a conventional direct conversion power transmitter. The comparison results are shown in FIGS. 4 and 5.

Figure 4:
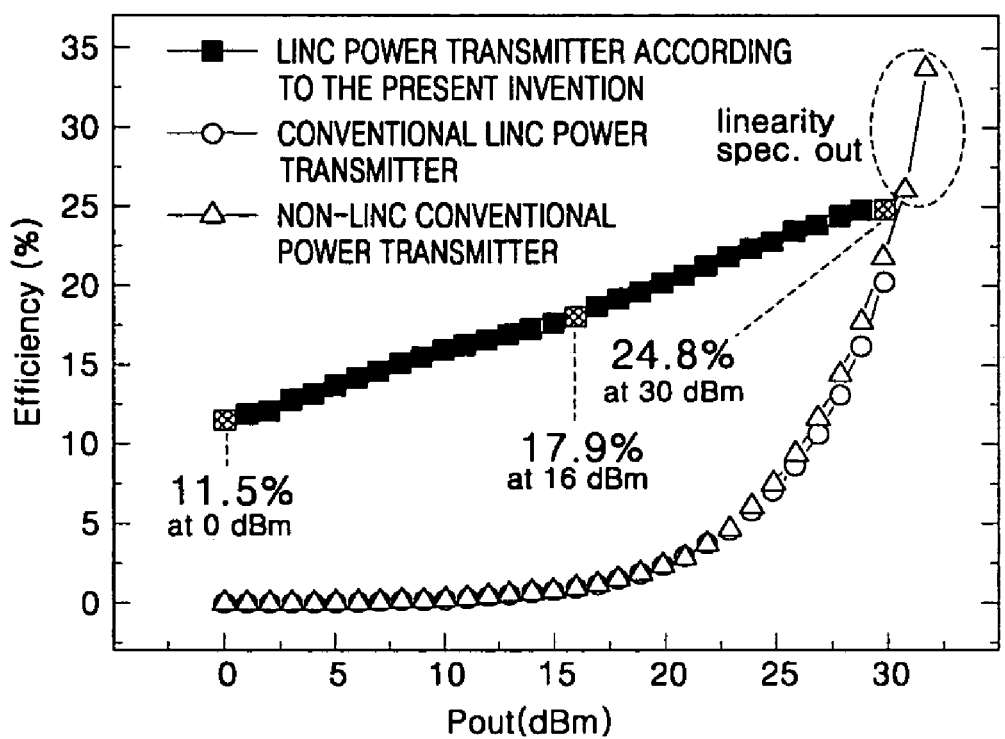
FIG. 4 is a graph showing the efficiency of a LINC power transmitter according to a preferred embodiment of the present invention.

In FIG. 4, in a given power range of 0~30 dBm, the efficiency of the LINC power transmitter according to the present invention is comparable with that of the conventional LINC power transmitter, which does not control bias of a power amplifier, and that of the conventional direct conversion power transmitter. More specifically, the efficiency of the conventional LINC power transmitter, like that of the conventional direct conversion power transmitter, is very low for a lower power range but rapidly increases for a higher power range, resulting in a curve with a high gradient, as shown in FIG. 4. On the other hand, the efficiency of the LINC power transmitter according to the present invention, which controls the bias of a power amplifier, generally remains high throughout the given power range, resulting in a curve with a very low gradient, as shown in FIG. 4. That the LINC power transmitter according to the present invention can achieve and maintain relatively high efficiency throughout such a wide range of power levels is one of the most important aspects and one of the biggest advantages of the present invention.

Figure 5:
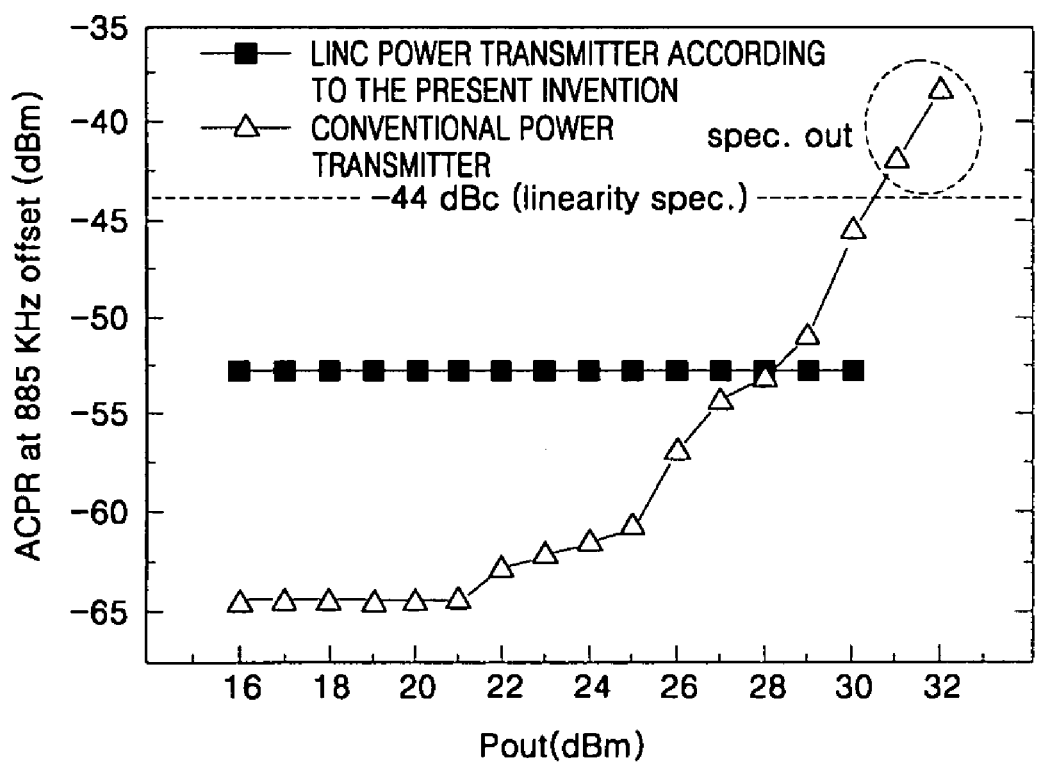
FIG. 5 is a graph showing the linearity of a LINC power transmitter according to a preferred embodiment of the present invention.

In FIG. 5, the LINC power transmitter according to the present invention is compared with the conventional LINC power transmitter and the conventional direct conversion power transmitter in terms of adjacent channel power ratio (ACPR). Referring to FIG. 5, unlike the LINC power transmitter according to the present invention, which has superior linear characteristics with ACPR maintained at a predetermined level irrespective of power variations, the conventional direct conversion power transmitter has poor linear characteristics with ACPR generally varying depending on power due to non-linearity of an amplifier therein. Therefore, it is safe to say that the LINC power transmitter according to the present invention is superior to the conventional LINC power transmitter and the conventional direct conversion power transmitter in terms of both efficiency and linearity.

As described above, according to the present invention, it is possible to realize a LINC power transmitter having higher efficiency, better linear characteristics, and less DC power consumption by forcefully saturating a main power amplifier of the LINC power transmitter with a high-level input signal and controlling the output of the main power amplifier to be at any desired level through adjustment of bias voltage of the main power amplifier. In addition, the present invention is ready to be applied to SDR technology that enables devices to flexibly change communication modes. Moreover, it is possible to achieve higher linearity and higher efficiency at the same time over a wider power range and thus make it easier to apply the present invention to the SDR technology, mobile communication technology, or other application technologies.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A linear amplification with nonlinear components (LINC) power transmitter, comprising:
    a digital signal processing unit which controls the LINC power transmitter;
    a frequency modulation unit which modulates or converts a digital signal output from the digital signal processing unit into a radio-frequency (RF) signal;
    a signal amplification unit which amplifies the RF signal output from the frequency modulation unit using a gain amplifier and a power amplification module; and
    a direct current/direct current (DC/DC) conversion unit which controls bias of the power amplification module, wherein the DC/DC conversion unit controls a base bias and/or a collect bias of the power amplification module, and the power amplification module operates in saturation; wherein the frequency modulation unit comprises:
    a digital/analog (D/A) converter which receives a digital signal output from the signal component separator and converts the received digital signal into an analog signal;
    a low pass filter which only passes a low frequency signal among analog signals output from the D/A converter;
    a quadrature modulator which quadrature-modulates a signal output from the low pass filter; and
    a local oscillator which provides an oscillation signal to operate the quadrature modulator.

2. The LINC power transmitter of claim 1, wherein the digital signal processing unit comprises:
    a signal component separator which separates a predetermined signal into its components;
    a local oscillator controller which controls a local oscillator of the frequency modulation unit; and
    a bias/level controller which controls the base bias signal and the collect bias signal to be provided to the signal amplification unit.

3. The LINC power transmitter of claim 1, wherein the signal amplification unit comprises:
    a gain amplifier which amplifies gain of a signal output from the quadrature modulator;
    a power amplification module which amplifies a signal output from the gain amplifier using the base bias and collect bias of the DC/DC conversion unit; and
    a signal combiner which combines output signals from the power amplification module.

4. The LINC power transmitter of claim 3, wherein the power amplification module comprises a power amplifier corresponding to the gain amplifier and is a commonly-used amplifier or a differential amplifier.

5. The LINC power transmitter of claim 3, wherein the DC/DC conversion unit comprises a DC/DC converter which is controlled by the bias/level controller of the digital signal processing unit, provides the base bias and the collect bias to the power amplification module and adjusts an output level of the power amplification module by bias control.

6. The LINC power transmitter of claim 1 being able to be applied to a software defined radio (SDR) power transmitter which changes communication modes using software.

7. A linear amplification with nonlinear components (LINC) power transmitter, comprising:
    a digital signal processing unit which controls the LINC power transmitter;
    a frequency modulation unit which modulates or converts a digital signal output from the digital signal processing unit into a radio-frequency (RF) signal;
    a signal amplification unit which amplifies the RF signal output from the frequency modulation unit using a gain amplifier and a power amplification module; and
    a direct current/direct current (DC/DC) conversion unit which controls bias of the power amplification module, wherein the DC/DC conversion unit controls a base bias and/or a collect bias of the power amplification module, and the power amplification module operates in saturation; wherein the power amplification module comprises a virtual ground for removing a predetermined error signal.

8. The LINC power transmitter of claim 7, wherein the power amplification module further comprises an impedance matching load which is connected to the virtual ground and removes the error signal.

9. The LINC power transmitter of claim 7, wherein the digital signal processing unit comprises:
    a signal component separator which separates a predetermined signal into its components;

a local oscillator controller which controls a local oscillator of the frequency modulation unit; and a bias/level controller which controls the base bias signal and the collect bias signal to be provided to the signal amplification unit.

10. The LINC power transmitter of claim 7 being able to be applied to a software defined radio (SDR) power transmitter which changes communication modes using software.

* * * * *